(12) United States Patent
Arrouy et al.

(10) Patent No.: US 7,692,855 B2
(45) Date of Patent: Apr. 6, 2010

(54) OPTICAL ARTICLE HAVING A TEMPERATURE-RESISTANT ANTI-REFLECTION COATING WITH OPTIMIZED THICKNESS RATIO OF LOW INDEX AND HIGH INDEX LAYERS

(75) Inventors: Frédéric Arrouy, Charenton (FR); Olivier Beinat, Charenton (FR); Luc Nouvelot, Charenton (FR); Michèle Thomas, Charenton (FR)

(73) Assignee: Essilor International Compagnie Generale d'Optique, Charenton-le-Pont (FR)

( * ) Notice: Subject to any disclaimer, the term of this patent is extended or adjusted under 35 U.S.C. 154(b) by 573 days.

(21) Appl. No.: 11/427,199

(22) Filed: Jun. 28, 2006

(65) Prior Publication Data

US 2008/0002260 A1    Jan. 3, 2008

(51) Int. Cl.
*G02B 1/10* (2006.01)
(52) U.S. Cl. ............... 359/382; 359/569; 359/580; 359/586; 359/588
(58) Field of Classification Search ............ 359/569, 359/580, 582, 586, 588
See application file for complete search history.

(56) References Cited

U.S. PATENT DOCUMENTS

| 5,764,416 | A | 6/1998 | Rahn | 359/586 |
| 6,590,702 | B1 | 7/2003 | Shirai | 359/359 |
| 2004/0036973 | A1 * | 2/2004 | Iori et al. | 359/581 |
| 2004/0095332 | A1 * | 5/2004 | Blanchard | 345/173 |
| 2005/0219724 | A1 | 10/2005 | Teramoto et al. | 359/883 |
| 2006/0158738 | A1 | 7/2006 | Nakamura et al. | 359/586 |

FOREIGN PATENT DOCUMENTS

| EP | 1184685 | 3/2002 |
| EP | 1184686 | 3/2002 |
| EP | 1 223 437 | 7/2002 |
| EP | 1 845 392 | 10/2007 |
| FR | 2 896 045 | 7/2007 |
| JP | H05-011101 | 1/1993 |
| JP | H05-03502 | 2/1993 |
| JP | H14-122820 | 4/2002 |

OTHER PUBLICATIONS

International Search Report and Written Opinion, International application No. PCT/EP2007/057798, mailed Dec. 27, 2007.

* cited by examiner

*Primary Examiner*—Joshua L Pritchett
(74) *Attorney, Agent, or Firm*—Fulbright & Jaworski L.L.P.

(57) ABSTRACT

The present invention relates to an optical article having anti-reflection properties and high thermal resistance, comprising a substrate having at least one main face coated with a multi-layer anti-reflection coating comprising a stack of at least one high refractive index layer and at least one low refractive index layer, wherein the ratio:

$$R_T = \frac{\text{sum of the physical thicknesses of the low refractive index layers of the anti-reflection coating}}{\text{sum of the physical thicknesses of the high refractive index layers of the anti-reflection coating}}$$

is higher than 2.1. If the anti-reflection stack comprises at least one low refractive index layer having a physical thickness $\geq 100$ nm which is not the outermost layer of the anti-reflection coating, said relatively thick layer and the underlying layers are not taken into account in $R_T$ calculation.

26 Claims, No Drawings

OPTICAL ARTICLE HAVING A TEMPERATURE-RESISTANT ANTI-REFLECTION COATING WITH OPTIMIZED THICKNESS RATIO OF LOW INDEX AND HIGH INDEX LAYERS

BACKGROUND OF THE INVENTION

1. Field of the Invention

The invention relates to an optical article comprising a substrate coated with a multi-layer transparent anti-reflection (AR) coating having an improved thermal resistance and good abrasion resistance, in particular an ophthalmic lens, and a method of manufacturing such optical article.

2. Description of Related Art

It is a common practice in the art to coat at least one main surface of a lens substrate, such as an ophthalmic lens or lens blank, with several coatings for imparting to the finished lens additional or improved optical or mechanical properties. These coatings are designated in general as functional coatings.

Thus, it is usual practice to coat at least one main surface of a lens substrate, typically made of an organic glass material, with successively, starting from the surface of the lens substrate, an impact-resistant coating (impact-resistant primer), an abrasion- and/or scratch-resistant coating (hard coat), an anti-reflection coating and, optionally, an anti-fouling top coat. Other coatings such as a polarized coating, a photochromic or a dyeing coating may also be applied onto one or both surfaces of the lens substrate.

An anti-reflection coating is defined as a coating, which improves the anti-reflective properties of an optical article when deposited at its surface. It reduces reflection of light at the interface article-air on a relatively wide band of the visible spectrum.

Anti-reflection coatings are well known and classically comprise a mono-layer or multi-layer stack of dielectric materials such as $SiO_2$, $SiO$, $Al_2O_3$, $MgF_2$, $LiF$, $Si_3N_4$, $TiO_2$, $ZrO_2$, $Nb_2O_5$, $Y_2O_3$, $HfO_2$, $Sc_2O_3$, $Ta_2O_5$, $Pr_2O_3$, and mixtures thereof. They are generally inorganic by nature.

It is also well known that anti-reflection coatings preferably are multi-layer coatings comprising alternatively high refractive index layers (HI) and low refractive index layers (LI).

It is also known to interleave a sub-layer between the substrate and the first anti-reflection layer in order to improve abrasion and/or scratch resistance of said coating and its adhesion to the substrate.

Generally, classical anti-reflection (AR) coatings have a satisfactory heat resistance up to about 70° C. Above this temperature, cracks may appear in the AR stack, in particular at the surface of the substrate of the optical article, which damages the AR coating. In the present patent application, the temperature from which cracks are beginning to be observed in an article or coating is called the critical temperature ($T_C$).

In the case of organic glass substrates (synthetic resin), deposition of the anti-reflection coating (optionally comprising a sub-layer) has to be performed through moderate temperature processes so as to avoid deterioration of the substrate. Taking such precaution is useless in the case of mineral glass substrates.

The consequence of a lower temperature treatment is, generally, in the case of organic glass substrates, a lower durability of the AR coating.

Moreover, organic glass substrates (either coated or uncoated) have a higher thermal expansion coefficient than inorganic materials constituting layers or sub-layers of the anti-reflection coating. The consequence is that they lead to articles which may develop high stress. Such stress may generate naked eye visible cracks or exfoliation in the AR coating upon increasing temperature.

This phenomenon is particularly noticeable when the organic substrate is based on diethylene glycol bis(allyl carbonate)monomers, episulfide monomers (materials having a refractive index $n \geq 1.70$), or polythiourethane (materials having a refractive index n equal to or higher than 1.60).

Different ways to improve the critical temperature of an optical article can be found in the literature.

US patent application 2005/0219724 describes an optical article coated with a multi-layer dielectric film, such as an anti-reflection coating, comprising alternate layers of high ($TiO_2$) and low ($SiO_2$ doped with a small amount of $Al_2O_3$, n=1.47) refractive indexes. According to this document, using $SiO_2/Al_2O_3$ mixtures instead of $SiO_2$ allows to decrease the stress in LI layers, and consequently the cracks appearance probability at the substrate surface.

Japanese patent H05-011101 (Hoya Corporation) describes the preparation of optical articles having initially a good thermal resistance, and which resistance to heating is maintained at a high level after several months. Both characteristics are obtained by the use of a $SiO_2/Al_2O_3$ sub-layer having a refractive index of 1.48-1.52, interleaved between the substrate and a multi-layer AR coating comprising HI and LI layers. Some LI layers are composed of a mixture of $Ta_2O_5 + Y_2O_3 + SiO_2$ and optionally $Al_2O_3$, leading to refractive indexes of 1.61-1.62, which is relatively high for a LI layer. The particular sub-layer improves the critical temperature of cracks appearance up to 100-105° C. at the initial stage.

Japanese patent H05-034502 is a variant of the latter Japanese patent in which the $SiO_2/Al_2O_3$ sub-layer was replaced with a 3-layer sub-layer $SiO_2/Ta_2O_5/SiO_2/Al_2O_3$ mixture. The critical temperature of the optical article is raised to 95-120° C. at the initial stage with a diethyleneglycol bis(allyl carbonate) substrate.

Japanese patent H14-122820 (Seiko Epson Corporation) describes a hard-coated substrate coated with a $SiO_2$ sub-layer having a physical thickness of 89-178 nm (optical thickness: 0.25-0.5λ at 520 nm) and a 4-layer anti-reflection coating $ZrO_2/SiO_2/ZrO_2/SiO_2$. According to this document, high critical temperatures can be reached by being able to balance coating thickness and stress between the layers of the various materials. However, the only parameter which was studied was the thickness of the sub-layer. Its thickness should be such that the ratio (sum of the physical thicknesses of the $SiO_2$ layers, including the sub-layer)/(sum of the physical thicknesses of the $ZrO_2$ layers) ranges from 2 to 3. Higher ratios are said to be undesirable because the durability of the AR coating is decreased. In fact, if the sub-layers having a physical thickness higher than or equal to 100 nm are not taken into account in the calculation, the LI/HI ratio is lower than or equal to 2 in the examples.

European patent application EP 1184685 (Hoya Corporation) describes an optical element having a plastic substrate and a λ/4-λ/2-λ/4 or λ/4-λ/4-λ/2-λ/4 AR film having a good heat resistance. The article is provided with a Nb (niobium metal) or $SiO_2$ sub-layer in order to promote adhesiveness between the plastic substrate and the AR film. There are two conditions to achieve good heat resistance: i) the use of a specific layer of λ/2, which must be an equivalent film containing at least three layers and having a refractive index of from 1.80 to 2.40; ii) the even-numbered layer of the equivalent film must be a $SiO_2$ layer.

European patent application EP 1184686 (Hoya Corporation) describes an optical element comprising a plastic substrate and, provided thereon in this order, a sub-layer comprising niobium metal (Nb) and an anti-reflection film. Said sub-layer is responsible for high adhesiveness between the plastic substrate and the anti-reflection coating, as well as excellent heat resistance and impact resistance. A $SiO_2$ sub-layer is taught to decrease thermal resistance of the optical element.

A commercially available anti-reflection stack which is temperature resistant is also known. Neomultidiafal nMD, supplied by Essilor, is a 4-layer coating $ZrO_2/SiO_2/ZrO_2/SiO_2$ with respective thicknesses 12, 54, 28 and 102 nm. It is deposited in that order onto an ORMA® substrate (polycarbonate substrate from Essilor based on CR-39® monomer) coated with an anti-abrasion-coating. The resulting optical article has a critical temperature of 110° C. However, an optical article coated on both sides with this commercial anti-reflection stack has a mean luminous reflection factor $R_v$ in the visible range (380-780 nm) as high as 2.3% (1.15% per face).

SUMMARY OF THE INVENTION

A first aim of this invention is to provide a transparent optical article comprising an organic or mineral glass substrate bearing an inorganic anti-reflection coating, preferably a lens, and more preferably an ophthalmic lens for eyeglasses, having an improved resistance to heat and temperature variations, i.e., a high critical temperature, which would be an alternative to already known thermally resistant AR coated optical articles.

Such an inorganic anti-reflection coating resistant to cracking would be particularly interesting if applied on the first face of a semi-finished lens, generally the front (convex) face, because it would then be possible to deposit by spin coating an AR coating on the second face of the lens (generally on the back side) followed by curing at elevated temperature without altering the AR on the front face.

A second aim of this invention is to provide an optical article bearing such an AR coating with high critical temperature (75-110° C.), without decreasing the optical and mechanical performances of said article, such as color and anti-reflection performances, cleanability, adhesion of the layers to the substrate, abrasion resistance and corrosion resistance.

Especially, the optical article should have a good resistance to dipping in hot water followed by mechanical surface solicitations.

Besides, its mean luminous reflection factor $R_v$ should be as low as possible. In addition, the critical temperature should be maintained at a high level even after a long time.

Another aim of this invention is to provide a process of manufacturing the above defined article, which could be easily integrated into the classical manufacturing chain and would avoid heating the substrate. The deposition of the layers might be performed at a temperature ranging from 20° C. to 30° C.

The inventors have found that these problems could be solved by optimizing the ratio of (total physical thickness of low refraction index layers of the antireflective stack)/(total physical thickness of high refraction index layers of the antireflective stack), or a slightly different ratio when the AR stack comprises at least one LI layer having a physical thickness ≧100 nm which is not the outermost layer of the AR stack. Compared to classical anti-reflection stacks having such low ratios, inventive anti-reflection stacks have higher ratios and higher critical temperatures, while exhibiting in the same time high abrasion resistance.

The present invention relates to an optical article having anti-reflection properties comprising a substrate having at least one main face coated with a multi-layer anti-reflection coating comprising a stack of at least one high refractive index layer and at least one low refractive index layer, wherein:

each low refractive index layer has a refractive index of 1.55 or less, each high refractive index layer has a refractive index higher than 1.55 and does not comprise niobium pentoxide ($Nb_2O_5$), said coated main face of the optical article has a mean luminous reflection factor $R_v \leq 1\%$, and:

(a) the low refractive index layers of the anti-reflection coating below the outermost layer of said coating each have a physical thickness <100 nm, the ratio $$R_T = \frac{\text{sum of the physical thicknesses of the low refractive index layers of the anti-reflection coating}}{\text{sum of the physical thicknesses of the high refractive index layers of the anti-reflection coating}}$$

is higher than 2.1, and the anti-reflection coating does not comprise a sub-layer comprising niobium (Nb), or:

(b) the anti-reflection coating comprises:

at least one low refractive index layer having a physical thickness ≧100 nm which is not the outermost layer of the anti-reflection coating, and at least one high refractive index layer and at least one low refractive index layer, which are located above the low refractive index layer having a physical thickness ≧100 nm and not being the outermost layer of the anti-reflection coating which is the furthest from the substrate, and the ratio $$R_T = \frac{\text{sum of the physical thicknesses of the low refractive index layers of the anti-reflection coating}}{\text{sum of the physical thicknesses of the high refractive index layers of the anti-reflection coating}}$$

is higher than 2.1, with the proviso that the layers of the anti-reflection coating taken into account for the calculation of said ratio $R_T$ are only the layers located above the low refractive index layer having a physical thickness ≧100 nm and not being the outermost layer of the anti-reflection coating which is the furthest from the substrate.

It is another object of the present invention to provide a method of manufacturing the above optical article, comprising the steps of:

providing an optical article having two main faces, forming on at least one main face of said optical article an anti-reflection coating such as described above, optionally comprising a sub-layer, wherein the layers of the anti-reflection coating are deposited by vacuum deposition.

Yet another object of the present invention is to provide a process for obtaining an optical article comprising a substrate having at least one main face coated with a multi-layer anti-reflection coating and having a critical temperature ≧75° C., wherein said anti-reflection coating exhibits a $R_T$ ratio higher than 2.1, with the above provisos, $R_T$ being such as defined above.

A further object of the present invention is the use of a $R_T$ ratio higher than 2.1 in a multi-layer anti-reflection coating deposited onto at least one main face of the substrate of an optical article, to obtain an optical article having a critical temperature ≧75° C., with the above provisos, $R_T$ being such as defined above.

Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description.

DETAILED DESCRIPTION OF THE INVENTION AND PREFERRED EMBODIMENTS

The terms "comprise" (and any grammatical variation thereof, such as "comprises" and "comprising"), "have" (and any grammatical variation thereof, such as "has" and "having"), "contain" (and any grammatical variation thereof, such as "contains" and "containing"), and "include" (and any grammatical variation thereof, such as "includes" and "including") are open-ended linking verbs. They are used to specify the presence of stated features, integers, steps or components or groups thereof, but do not preclude the presence or addition of one or more other features, integers, steps or components or groups thereof. As a result, a method, or a step in a method, that "comprises," "has," "contains," or "includes" one or more steps or elements possesses those one or more steps or elements, but is not limited to possessing only those one or more steps or elements.

Unless otherwise indicated, all numbers or expressions referring to quantities of ingredients, reaction conditions, etc. used herein are to be understood as modified in all instances by the term "about."

Herein, the term "lens" means an organic or mineral glass lens, comprising a lens substrate which may be coated with one or more coatings of various natures.

When the optical article comprises one or more surface coatings, the term "to deposit a layer onto the optical article" means that a layer is deposited onto the outermost coating of the optical article.

The terms AR coating and AR stack have the same meaning.

By outermost layer of the anti-reflection coating, it is meant the layer of the anti-reflection coating which is the furthest from the substrate.

By innermost layer of the anti-reflection coating, it is meant the layer of the anti-reflection coating which is the closest to the substrate.

By inner layer of the anti-reflection coating, it is meant any layer of the anti-reflection coating except for the outermost layer of said AR coating.

By "a layer 1 under/below a layer 2", it is to be understood that layer 2 is further from the substrate than layer 1 is.

By "a layer 1 on/above a layer 2", it is to be understood that layer 2 is closer to the substrate than layer 1 is.

In the present invention, the anti-reflection coating is designed with a ratio $R_T$ as high as possible so as to increase the resistance to temperature of the optical article. Actually, a relationship has been established between critical temperature and the ratio $R_T$ mentioned above.

Without wishing to be bound to any particular theory, applicant believes that cracks in AR stacks are initiated inside a high refractive index layer. In order to become visible, the cracks must propagate inside the AR coating and have their size increased. A hypothesis that could be formulated, without the applicant being related to it, is that LI layers have better elongation resistance than HI layers, and can limit the cracks if their thickness is sufficient. As a consequence, it is necessary to have a high physical thickness ratio $R_T$, which is calculated on the whole AR stack unless an inner LI layer of 100 nm or more is present in the AR stack. Actually, if a high thickness LI layer (higher than 100 nm) is present inside the anti-reflection coating, it may block the propagation of the cracks. In this case, ratio $R_T$ has to be calculated on the upper part of the stack, i.e., without taking into account said high thickness LI layer and the layers lying under. If several high thickness LI layers are present, $R_T$ is calculated on the part of the stack located above the thick low refractive index layer having a physical thickness ≧100 nm and not being the outermost layer of the anti-reflection coating which is the furthest from the substrate.

Another hypothesis that could be formulated, without the applicant being related to it, is that the structure of optical stacks, in particular the physical thickness ratio of each material, has an influence on the stress condition of the stack. The higher the compression stress (LI layers are under compression), the better the critical temperature performance.

It is worth noting that, in the present application, monolayer or multi-layer sub-layers (which are optional components) are considered to be part of the anti-reflection stack, even if they do not contribute to the anti-reflection properties of the optical article. Consequently, thickness of a layer of an optional sub-layer is taken into account in the $R_T$ calculations, unless said layer lies under a low refractive index layer having a physical thickness ≧100 nm which is not the outermost layer of the anti-reflection coating or unless said layer is a low refractive index layer having a physical thickness ≧100 nm. In the latter case, thicknesses of the layers lying under the LI layer of the sub-layer having a physical thickness ≧100 nm and the LI layer of the sub-layer having a physical thickness ≧100 nm are not taken into account in the $R_T$ calculations.

It is also worth noting that the outermost layer of the AR stack can be a LI layer having a thickness of 100 nm or more (in this case, it is considered for $R_T$ calculation). Unless otherwise noted, all thicknesses mentioned in the present patent application are physical thicknesses.

$R_T$ is preferably higher than or equal to any one of the following values: 2.15, 2.2, 2.25, 2.3, 2.35, 2.4, 2.45, 2.5, 2.75, 3, 3.5, 4.

The critical temperature of an article coated according to the invention is preferably ≧75° C., more preferably ≧80° C., even better ≧85° C. and best ≧90° C.

As used herein, a low refractive index layer is intended to mean a layer with a refractive index of 1.55 or less, preferably lower than 1.50 and even better lower than 1.45, and a high refractive index layer is intended to mean a layer with a refractive index higher than 1.55, preferably higher than 1.6, more preferably higher than 1.8 and even better higher than 2, both at a reference wavelength of 550 nm. Unless otherwise noted, all refractive indexes indicated in the present patent application are expressed at 25° C. and λ=550 nm.

HI layers are classical high refractive index layers and may comprise, without limitation, one or more mineral oxides such as $TiO_2$, $PrTiO_3$, $LaTiO_3$, $ZrO_2$, $Ta_2O_5$, $Y_2O_3$, $Ce_2O_3$, $La_2O_3$, $Dy_2O_5$, $Nd_2O_5$, $HfO_2$, $Sc_2O_3$, $Pr_2O_3$ or $Al_2O_3$, or $Si_3N_4$, as well as mixtures thereof, preferably $TiO_2$ or $PrTiO_3$. HI layers may optionally contain low refractive index materials such as $SiO_2$. Obviously, mixtures of those compounds are such that the refractive index of the resulting layer is as defined above (higher than 1.55). HI layers do not contain $Nb_2O_5$ and are not prepared by evaporation of a mixture of compounds comprising $Nb_2O_5$.

$TiO_2$ is the most preferred HI material. Thanks to its high refractive index (n=2.35 at 500 nm), the physical thickness of HI layers can be decreased and the $R_T$ ratio can be increased. In a preferred embodiment, at least one HI layer of the anti-reflection stack comprises $TiO_2$, preferably consists in $TiO_2$. It is preferably deposited under ionic assistance (IAD), which decreases its tensile strength and increases its refractive index.

According to another preferred embodiment, at least one HI layer of the anti-reflection stack comprises $PrTiO_3$, preferably consists in $PrTiO_3$. Due to its high thermal resistance, this oxide material is particularly interesting. It is to be noted that its high thermal resistance may also be responsible of a less spectacular effect of a high $R_T$ ratio on the critical temperature.

LI layers are also well known and may comprise, without limitation, $SiO_2$, $MgF_2$, $ZrF_4$, $Al_2O_3$, $AlF_3$, chiolite ($Na_3[Al_3F_{14}]$), cryolite ($Na_3[AlF_6]$), or mixtures thereof, preferably $SiO_2$ or $SiO_2$ doped with $Al_2O_3$ which contributes to raising the critical temperature of the stack. Obviously, mixtures of those compounds are such that the refractive index of the resulting layer is as defined above (lower than or equal to 1.55). When $SiO_2/Al_2O_3$ mixtures are used, the LI layer preferably contains from 1 to 10%, more preferably from 1 to 8% by weight of $Al_2O_3$ relative to the total weight of $SiO_2+Al_2O_3$ in said layer. A too high amount of alumina is detrimental to adhesion of the AR coating.

For example, $SiO_2$ doped with 4% or less $Al_2O_3$ by weight, or $SiO_2$ doped with 8% $Al_2O_3$ by weight may be employed. Commercially available $SiO_2/Al_2O_3$ mixtures can also be employed, such as LIMA® supplied by Umicore Materials AG (refractive index n=1.48-1.50 at 550 nm), or substance L5® supplied by Merck KGaA (refractive index n=1.48 at 500 nm). The most preferred material for LI layers is $SiO_2$ doped with 8% $Al_2O_3$ by weight. This material leads to anti-reflection stacks with the highest level of critical temperature, which is moreover maintained even after several months. Said stacks are also the most compressive ones.

In a preferred embodiment, at least one LI layer of the anti-reflection coating comprises a mixture of $SiO_2$ and $Al_2O_3$, preferably consists in a mixture of $SiO_2$ and $Al_2O_3$. In another preferred embodiment, all LI layers of the anti-reflection coating (except the LI layer(s) of the sub-layer, if said anti-reflection coating comprises a sub-layer having at least one LI layer) comprise a mixture of $SiO_2$ and $Al_2O_3$, preferably consist in a mixture of $SiO_2$ and $Al_2O_3$.

According to a preferred embodiment of the invention, the outermost layer of the AR coating is a LI layer deposited onto a HI layer such that the ratio $R'_T$ (physical thickness of the outermost layer of the AR coating)/(physical thickness of the second last layer of the AR coating) is higher than or equal to 2, better 2.1, more preferably higher than or equal to 2.2, even more preferably higher than or equal to 2.5, better higher than or equal to 3, best higher than or equal to 3.5, and optimally higher than or equal to 4.

Generally, HI layers have a physical thickness ranging from 10 to 120 nm, and LI layers have a physical thickness ranging from 10 to 100 nm.

Preferably, the total physical thickness of the anti-reflection coating is lower than 1 micrometer, more preferably lower than or equal to 500 nm and even better lower than or equal to 250 nm. The total physical thickness of the anti-reflection coating is generally higher than 100 nm, preferably higher than 150 nm.

The anti-reflection coating of the present invention may include any layer or stack of layers which improves the anti-reflective properties of the finished optical article over at least one portion of the visible spectrum, thereby increasing the transmission of light and reducing surface reflectance.

Preferably, the multi-layer anti-reflection coating comprises at least two LI layers and at least two HI layers. Preferably, the total number of layers in the anti-reflection coating is $\leq 9$, preferably $\leq 7$.

According to a particular embodiment of the invention, the anti-reflection coating does not comprise four anti-reflection layers.

LI and HI layers are not necessarily alternated in the AR stack, although the anti-reflection coating may comprise an alternated stack of low refractive index and high refractive index layers according to a particular embodiment of the invention. Two or more HI layers may be deposited on one another; two or more LI layers may be deposited on one another.

In a preferred embodiment, the outermost layer of the multi-layer AR stack is a low refractive index layer.

Optionally, the anti-reflection coating comprises a sub-layer. By "sub-layer" is meant a layer which is generally employed for purposes of adhesion improvement or abrasion and/or scratch resistance improvement. In the present patent application, the AR coating comprises "anti-reflection layers" and optionally comprises a sub-layer. Said sub-layer is considered to be part of the anti-reflection stack, albeit it is not referred to as an "anti-reflection layer." It is interleaved between the substrate (either naked or coated) and the anti-reflection layers of the AR coating, i.e., those having a significant effect on the AR properties of the optical article. Sub-layers generally have a relatively high thickness, and generally do not take part to the anti-reflective optical activity and generally do not have a significant optical effect.

Sub-layers are sometimes referred to as under-layers, underlying layers, primer layers, basic layers, lower layers, adhesion layers, subbing layers or foundation layers in the literature.

Optionally, the sub-layer may be laminated, i.e., composed of several layers. Mono-layer sub-layers are preferred to multi-layer sub-layers.

Thickness of the sub-layer has to be sufficient to promote abrasion resistance of the other layers of the anti-reflection coating to the substrate. When present, the sub-layer is generally formed on an anti-abrasion and/or scratch resistant coating.

Said sub-layer preferably has a thickness higher than or equal to 75 nm, more preferably $\geq 80$ nm, even more preferably $\geq 100$ nm, and better $\geq 120$ nm. Its thickness is generally lower than 250 nm, preferably lower than 200 nm.

It may comprise one or more materials conventionally used for preparing sub-layers, for instance one or more dielectric materials chosen from materials previously described in the present specification.

Preferably, the sub-layer is a SiO$_2$ based mono-layer sub-layer, more preferably free of Al$_2$O$_3$. In this case, said SiO$_2$ sub-layer is considered as a low refractive index layer of the AR stack. Most preferably, the sub-layer is a mono-layer sub-layer consisting of SiO$_2$.

In another preferred embodiment, the sub-layer is a multi-layer sub-layer consisting of:
one layer consisting of SiO$_2$, having preferably a thickness higher than or equal to 75 nm, more preferably ≧80 nm, even more preferably ≧100 nm, and better ≧120 nm; and
at most three layers interleaved between said layer consisting of SiO$_2$ and the substrate of the optical article, which can be a coated substrate.

In another embodiment, the sub-layer consists of a thin layer of at least one metal or metal oxide having 10 nm thickness or less, preferably 5 nm thickness or less.

When the low refractive index layers of the anti-reflection coating below the outermost layer of said coating, i.e., the inner LI layers, each have a physical thickness <100 nm, the anti-reflection coating does not comprise a sub-layer comprising niobium metal (Nb).

According to a particular embodiment of the invention, the inventive anti-reflection coating does not comprise any sub-layer.

According to another particular embodiment of the invention, in the case when the anti-reflection coating comprises at least one low refractive index layer having a physical thickness ≧100 nm which is not the outermost layer of the anti-reflection coating, the anti-reflection coating does not comprise a sub-layer comprising niobium (Nb).

It is well known that optical articles have a tendency to get charged with static electricity, especially when they are cleaned in dry conditions by rubbing their surface with a cloth or polyester piece. As a consequence, they may attract and fix small particles lying close to the lens, such as dusts, as long as the charge remains on the lens.

It is known in the art to include at least one electrically conductive layer inside an anti-reflection stack in order to confer to the anti-reflection coated lens antistatic properties. This helps in quickly dissipating the charges. Substrates coated with an AR stack including an electrically conductive layer have been described, for example, in international patent application WO 01/55752 and European patent EP 0834092.

The optical article of the invention can be rendered anti-static through incorporation of at least one electrically conductive layer within the AR stack. It is preferably deposited onto the optional sub-layer or an anti-reflection layer of the AR stack.

By "antistatic", it is meant the property of not retaining and/or developing an appreciable electrostatic charge. An article is generally considered to have acceptable antistatic properties when it does not attract or fix dust or small particles after having been rubbed with an appropriate cloth.

The ability of a glass to evacuate a static charge created by rubbing with a cloth or any other electrostatic charge generation process (charge applied by corona . . . ) can be quantified by measuring the time required for said charge to be dissipated. Thus, antistatic glasses have a discharge time in the order of 100 milliseconds, while static glasses have a discharge time in the order of several tenth seconds.

The electrically conductive layer of the invention may be located anywhere in the AR coating, provided that it does not impair significantly the anti-reflection properties of the coating. It may be the innermost layer of the AR coating, i.e., the layer of the AR coating which is the closest to the substrate of the optical article, or the outermost layer of the AR coating, i.e., the layer of the AR coating which is the furthest from the substrate of the optical article, or any inside layer of the AR coating. It is preferably positioned under a low refractive index layer.

The electrically conductive layer has to be sufficiently thin so as to not impair transparency of the antireflection coating. Generally, its thickness ranges from 0.1 to 150 nm, and better from 0.1 to 50 nm, depending on its nature. A thickness lower than 0.1 nm does generally not allow for obtaining a sufficient electrical conductivity, while a thickness higher than 150 nm does generally not allow for obtaining the required transparency and weak absorption properties.

The electrically conductive layer is preferably made from an electrically conductive and highly transparent material. In such a case, its thickness preferably ranges from 0.1 to 30 nm, more preferably from 1 to 20 nm and even better from 1 to 10 nm.

Said electrically conductive and highly transparent material is preferably a metal oxide chosen from indium oxides, tin oxides, zinc oxides and mixtures thereof. Indium-tin oxide (In$_2$O$_3$:Sn, indium oxide doped with tin) and tin oxide (In$_2$O$_3$) are preferred. According to the most preferred embodiment of the invention, the electrically conductive and optically transparent layer comprises indium-tin oxide, preferably is an indium-tin oxide layer, abbreviated as ITO.

Generally, the electrically conductive layer contributes to anti-reflection properties and is a high refractive index layer of the AR coating. Examples are layers made from an electrically conductive and highly transparent material such as ITO layers.

The electrically conductive layer may also be a very thin noble metal layer, typically of less than 1 nm thick, preferably less than 0.5 nm thick.

The optical article of the present invention preferably is a transparent optical article, more preferably a lens, which may be finished or semi-finished, and even more preferably an ophthalmic lens. The lens can also be a polarized lens or a photochromic lens.

A finished lens is defined as a lens obtained in its definitive shape, having both of its main faces surfaced or cast to the required geometry. It is generally produced by pouring polymerizable compositions between two molds exhibiting required surface geometries and then polymerizing.

A semi-finished lens is defined as a lens having only one of its main faces (generally the front face of the lens) surfaced or cast to the required geometry. The remaining face, preferably the rear face of the lens, has then to be surface-finished to the desired shape.

According to the invention, the optical article comprises a substrate, preferably transparent, in mineral or organic glass having rear and front main faces, at least one of which being coated with the inventive multi-layer anti-reflection coating. Both main faces of the optical article may be coated with an anti-reflection coating according to the invention.

In the case of a lens, the rear (back) face (generally the concave face) of the substrate is the face of the lens substrate which, in use, is the closest to the wearer's eye. The front face (generally the convex face) of the lens substrate is the face of the lens substrate which, in use, is the farthest from the wearer's eye.

The substrate may be made of mineral glass or organic glass, preferably organic glass (polymer substrate). The organic glasses can be made of any material currently used for organic ophthalmic lenses, e.g., thermoplastic materials such as polycarbonates and thermoplastic polyurethanes or thermosetting (cross-linked) materials such as those obtained by polymerization of allyl derivatives such as the allyl carbonates of linear or branched aliphatic or aromatic polyols, such as ethylene glycol bis(allyl carbonate), diethylene glycol bis (2-methyl carbonate), diethylene glycol bis(allyl carbonate), ethylene glycol bis(2-chloroallyl carbonate), triethylene glycol bis(allyl carbonate), 1,3-propanediol bis(allyl carbonate), propylene glycol bis(2-ethylallyl carbonate), 1,3-butenediol bis(allyl carbonate), 1,4-butenediol bis(2-bromoallyl carbonate), dipropylene glycol bis(allyl carbonate), trimethylene glycol bis(2-ethylallyl carbonate), pentamethylene glycol bis (allyl carbonate), isopropylene bisphenol-A bis(allyl carbonate), poly(meth)acrylates and copolymers based substrates, such as substrates obtained by the polymerization of alkyl methacrylates, in particular $C_1$-$C_4$ alkyl methacrylates such as methyl(meth)acrylate and ethyl(meth)acrylate, substrates comprising (meth)acrylic polymers and copolymers derived from bisphenol-A, polyethoxylated aromatic (meth)acrylates such as the polyethoxylated bisphenolate di(meth)acrylates, polythio(meth)acrylates, thermosetting polyurethanes, polythiourethanes, polyepoxides, polyepisulfides, as well as copolymers thereof and blends thereof.

Substrates particularly recommended are polycarbonates, in particular substrates obtained by polymerization or copolymerization of diethylene glycol bis(allyl carbonate), sold under the trade name CR-39® by PPG INDUSTRIES (ORMA® ESSILOR lens).

Among other recommended substrates are substrates obtained by polymerization of thio(meth)acrylic monomers, such as those disclosed in the French patent application FR 2734827.

The substrates may obviously be obtained by polymerizing mixtures of the above monomers. By (co)polymer, it is meant a copolymer or polymer. By (meth)acrylate, it is meant an acrylate or methacrylate.

Preferred organic substrates are those having a thermal expansion coefficient ranging from $50.10^{-6}$ $C.^{-1}$ to $180.10^{-6}$ $C.^{-1}$, preferably from $100.10^{-6}$ $C.^{-1}$ to $180.10^{-6}$ $C.^{-1}$.

The AR coating may be formed onto a naked substrate or onto the outermost coating layer of the substrate if the substrate is coated with surface coatings.

According to the invention, the optical article may comprise a substrate coated with various coating layers, chosen from, without limitation, an impact-resistant coating (impact resistant primer), an abrasion- and/or scratch-resistant coating (hard coat), a polarized coating, a photochromic coating, a dyeing coating, an anti-fouling top coat.

The AR coating is preferably formed onto an impact-resistant coating or an abrasion- and/or scratch-resistant coating.

In one embodiment of the invention, at least one main surface of the lens substrate is coated with successively, starting from the surface of the lens substrate, an impact-resistant coating (impact-resistant primer), an abrasion- and/or scratch-resistant coating (hard coat), the inventive anti-reflection coating and an anti-fouling top coat.

In another embodiment of the invention, at least one main surface of the lens substrate is coated with successively, starting from the surface of the lens substrate, an abrasion- and/or scratch-resistant coating (hard coat), the inventive anti-reflection coating and an anti-fouling top coat.

The impact-resistant primer coating which may be used in the present invention can be any coating typically used for improving impact resistance of a finished optical article. Also, this coating generally enhances adhesion, if present, of the abrasion and/or scratch-resistant coating on the substrate of the finished optical article. By definition, an impact-resistant primer coating is a coating which improves the impact resistance of the finished optical article as compared with the same optical article but without the impact-resistant primer coating.

Typical impact-resistance primer coatings are (meth) acrylic based coatings and polyurethane based coatings. (Meth)acrylic based impact-resistant coatings are, among others, disclosed in U.S. Pat. Nos. 5,015,523 and 6,503,631 whereas thermoplastic and cross-linked based polyurethane resin coatings are disclosed inter alia, in Japanese Pat. Nos. 63-141001 and 63-87223, EP Pat. No. 0404111 and U.S. Pat. No. 5,316,791.

In particular, the impact-resistant primer coating according to the invention can be made from a latex composition such as a poly(meth)acrylic latex, a polyurethane latex or a polyester latex.

Among the preferred (meth)acrylic based impact-resistant primer coating compositions there can be cited polyethylene glycol(meth)acrylate based compositions such as, for example, tetraethylene glycoldiacrylate, polyethylene glycol (200) diacrylate, polyethylene glycol (400) diacrylate, polyethylene glycol (600) di(meth)acrylate, as well as urethane (meth)acrylates and mixtures thereof.

Preferably the impact-resistant primer coating has a glass transition temperature (Tg) of less than 30° C. Among the preferred impact-resistant primer coating compositions, there may be cited the acrylic latex commercialized under the name Acrylic latex A-639 by Zeneca and polyurethane latexes commercialized under the names W-240 and W-234 by Baxenden Chemicals.

In a preferred embodiment, the impact-resistant primer coating may also include an effective amount of a coupling agent in order to promote adhesion of the primer coating to the optical substrate and/or to the scratch-resistant coating. The same coupling agents, in the same amounts, as for the abrasion and/or scratch-resistant coating compositions described below, can be used with the impact-resistant coating compositions.

The impact-resistant primer coating composition can be applied onto the lens substrate using any classical method such as spin, dip, or flow coating.

The impact-resistant primer coating composition can be simply dried or optionally pre-cured before molding of the optical substrate. Depending upon the nature of the impact-resistant primer coating composition, thermal curing, UV-curing or a combination of both can be used.

Thickness of the impact-resistant primer coating, after curing, typically ranges from 0.05 to 30 μm, preferably 0.5 to 20 μm and more particularly from 0.6 to 15 μm, and even better 0.6 to 5 μm.

The surface of the article onto which the impact-resistant primer coating is deposited may optionally be subjected to a physical or chemical pre-treatment step intended to improve adhesion, for example a high-frequency discharge plasma treatment, a glow discharge plasma treatment, a corona treatment, an electron beam treatment, an ion beam treatment, a solvent treatment or an acid or base (NaOH) treatment.

Any known optical abrasion- and/or scratch-resistant coating composition can be used to form the abrasion- and/or scratch-resistant coating of the invention. Thus, the abrasion-and/or scratch-resistant coating composition can be a UV and/or a thermal curable composition.

By definition, an abrasion- and/or scratch-resistant coating is a coating which improves the abrasion- and/or scratch-resistance of the finished optical article as compared to a same optical article but without the abrasion- and/or scratch-resistant coating. Preferred coating compositions are (meth)acrylate based coatings. The term (meth)acrylate means either methacrylate or acrylate.

The main component of the (meth)acrylate based coating compositions may be chosen from monofunctional (meth) acrylates and multifunctional (meth)acrylates such as difunctional(meth)acrylates; trifunctional(meth)acrylates; tetrafunctional(meth)acrylates, pentafunctional(meth)acrylates, hexafunctional(meth)acrylates.

Examples of monomers which may be used as main components of (meth)acrylate based coating compositions are:

Monofunctional (meth)acrylates: allyl methacrylate, 2-ethoxyethyl acrylate, 2-ethoxyethyl methacrylate, caprolactone acrylate, isobornyl methacrylate, lauryl methacrylate, polypropylene glycol monomethacrylate.

Difunctional (meth)acrylates: 1,4-butanediol diacrylate, 1,6-hexanediol diacrylate, 1,6-hexanediol dimethacrylate, polyethylene glycol diacrylate, tetraethylene glycol diacrylate, polyethylene glycol dimethacrylate, polyethylene glycol diacrylate, ethoxylated bisphenol A diacrylate, tetraethylene glycol diacrylate, tripropylene glycol diacrylate, neopentyl glycol diacrylate, 1,4-butanediol dimethacrylate, tetraethylene glycol dimethacrylate, diethylene glycol diacrylate.

Trifunctional (meth)acrylates: trimethylolpropane trimethacrylate, Trimethylolpropane triacrylate, pentaerythritol triacrylate, ethoxylated trimethylolpropane triacrylate, trimethylolpropane trimethacrylate.

Tetra to hexa(meth)acrylates: dipentaerythritol pentaacrylate, pentaerythritol tetraacrylate, ethoxylated pentaerythritol tetraacrylate, pentaacrylate esters.

Other preferred abrasion- and/or scratch-resistant coatings are silicon containings coatings, especially those obtained by curing a precursor composition including silanes or a hydrolyzate thereof, preferably epoxysilanes, and more preferably the epoxyalkoxysilanes disclosed in FR 2702486 (EP 0614957), WO 94/10230, U.S. Pat. Nos. 4,211,823 and 5,015,523.

A particularly preferred composition for an abrasion- and/or scratch-resistant coating is disclosed in FR 2702486. Said preferred composition comprises a hydrolyzate of an epoxytrialkoxysilane and dialkyldialkoxysilane, colloidal mineral fillers and a catalytic amount of an aluminum-based curing catalyst, the remaining of the composition being essentially comprised of solvents typically used for formulating these compositions. A surfactant is also preferably added in the composition so as to improve the optical quality of the deposit.

Especially preferred epoxyalkoxysilane based abrasion- and/or scratch-resistant coating compositions are those comprising as the main constituents an hydrolyzate of γ-glycidoxypropyl-trimethoxysilane (GLYMO) as the epoxytrialkoxysilane component, an hydrolyzate of dimethyldiethoxysilane (DMDES) as the dialkyldialkoxysilane component, colloidal silica and a catalytic amount of aluminum acetylacetonate.

In order to improve the adhesion of the abrasion- and/or scratch-resistant coating to the impact-resistant primer coating, an effective amount of at least one coupling agent can be added to the abrasion- and/or scratch-resistant coating composition. The preferred coupling agent is a pre-condensed solution of an epoxyalkoxysilane and an unsaturated alkoxysilane, preferably comprising a terminal ethylenic double bond.

Examples of epoxyalkoxysilanes are GLYMO, γ-glycidoxypropyl-pentamethyldisiloxane, γ-glycidoxypropyl-methyl-diisopropenoxysilane, γ-glycidoxypropyl-methyl-diethoxysilane, γ-glycidoxypropyl-dimethyl-ethoxysilane, γ-glycidoxypropyl-diisopropyl-ethoxysilane and γ-glycidoxypropyl-bis(trimethylsiloxy)methylsilane. The preferred epoxyalkoxysilane is GLYMO.

The unsaturated alkoxysilane can be a vinylsilane, an allylsilane, an acrylic silane or a methacrylic silane.

Examples of vinylsilanes are vinyltris(2-methoxyethoxy) silane, vinyltrisisobutoxysilane, vinyltri-tert-butoxysilane, vinyltriphenoxysilane, vinyltrimethoxysilane, vinyltriisopropoxysilane, vinyltriethoxysilane, vinyl-triacetoxysilane, vinylmethyldiethoxysilane, vinylmethyldiacetoxysilane, vinylbis(trimethylsiloxy)silane and vinyldimethoxyethoxysilane.

Examples of allylsilanes are allyltrimethoxysilane, alkyltriethoxysilane and allyltris(trimethylsiloxy)silane.

Examples of acrylic silanes are 3-acryloxypropyltris(trimethylsiloxy)silane, 3-acryloxy-propyl-trimethoxysilane, acryloxy-propylmethyl-dimethoxy-silane, 3-acryloxypropyl-methylbis(trimethylsiloxy)silane, 3-acryloxypropyl-dimethylmethoxysilane, N-(3-acryloxy-2-hydroxypropyl)-3-aminopropyl-triethoxysilane.

Examples of methacrylic silanes are 3-methacryloxypropyltris(vinyldimethoxylsiloxy)silane, 3-methacryloxypropyltris(trimethylsiloxy)silane, 3-methacryloxypropyltris(methoxyethoxy)silane, 3-methacryloxy-propyl-trimethoxysilane, 3-methacryloxypropyl-pentamethyl-disiloxane, 3-methacryloxy-propyl-methyldimethoxysilane, 3-methacryloxypropylmethyl-diethoxy-silane, 3-methacryloxypropyl-dimethyl-methoxysilane, 3-methacryloxy-propyl-dimethylethoxysilane, 3-methacryloxy-propenyl-trimethoxy-silane and 3-methacryloxy-propylbis(trimethylsiloxy)methylsilane.

The preferred silane is acryloxypropyl-trimethoxysilane.

Preferably, the amounts of epoxyalkoxysilane(s) and unsaturated alkoxysilane(s) used for the coupling agent preparation are such that the weight ratio:

$$R = \frac{\text{weight of epoxyalkoxysilane}}{\text{weight of unsaturated alkoxysilane}}$$

verifies the condition $0.8 \leq R \leq 1.2$.

The coupling agent preferably comprises at least 50% by weight of solid material from the epoxyalkoxysilane(s) and unsaturated alkoxysilane(s) and more preferably at least 60% by weight. The coupling agent preferably comprises less than 40% by weight of liquid water and/or organic solvent, more preferably less than 35% by weight.

The expression "weight of solid material from epoxyalkoxy silanes and unsaturated alkoxysilanes" means the theoretical dry extract from those silanes which is the calculated weight of unit $Q_k \text{Si} O_{(4-k)/2}$ where Q is the organic group that bears the epoxy or unsaturated group and $Q_k \text{Si} O_{(4-k)/2}$ comes from $Q_k \text{Si} R'O_{(4-k)}$ where Si—R' reacts to form Si—OH on hydrolysis. k is an integer from 1 to 3 and is preferably equal to 1. R' is preferably an alkoxy group such as $OCH_3$.

The water and organic solvents referred to above come from those which have been initially added in the coupling agent composition and the water and alcohol resulting from the hydrolysis and condensation of the alkoxysilanes present in the coupling agent composition.

Preferred preparation methods for the coupling agent comprise:

1) mixing the alkoxysilanes;
2) hydrolyzing the alkoxysilanes, preferably by addition of an acid, such as hydrochloric acid;
3) stirring the mixture;
4) optionally adding an organic solvent;
5) adding one or several catalyst(s) such as aluminum acetylacetonate; and
6) stirring (typical duration: overnight).

Typically, the amount of coupling agent introduced in the scratch-resistant coating composition represents 0.1 to 15% by weight of the total composition weight, preferably 1 to 10% by weight.

The abrasion- and/or scratch-resistant coating composition can be applied, generally onto the impact-resistant primer coating or onto the substrate using any classical method such as spin, dip or flow coating.

The abrasion- and/or scratch-resistant coating composition can be simply dried or optionally pre-cured before application of a subsequent anti-reflection coating. Depending upon the nature of the abrasion- and/or scratch-resistant coating composition, thermal curing, UV-curing or a combination of both can be used.

Thickness of the abrasion- and/or scratch-resistant coating, after curing, usually ranges from 1 to 15 μm, preferably from 2 to 6 μm, preferably from 3 to 5 μm.

Before deposition of the optional sub-layer and the anti-reflection layers onto the substrate, which may be coated, for example with an abrasion- and/or scratch-resistant coating, the surface of said optionally coated substrate is preferably subjected to a pre-treatment intended to increase adhesion of the layers. As a treatment step, a high-frequency discharge plasma method, a glow discharge plasma method, a corona treatment, a bombardment with energetic species, for example an electron beam method or an ion beam method ("Ion Pre-Cleaning" or "IPC") can be employed. Such pre-treatments are usually performed under vacuum. An acid or base pre-treatment may also be used.

By energetic species, it is meant species with an energy ranging from 1 to 150 eV, preferably from 10 to 150 eV, and more preferably from 40 to 150 eV. Energetic species may be chemical species such as ions, radicals, or species such as photons or electrons.

Thanks to these cleaning treatments, cleanliness of the substrate surface is optimized. A treatment by ionic bombardment is preferred. It is also possible to subject at least one layer of the optional sub-layer or at least one anti-reflection layer to such surface preparation treatments before deposition of the subsequent layer.

The layer of anti-fouling top coat which may be used in the present invention is a low surface energy top coat. It may be deposited onto at least part of the inventive AR coating, preferably onto the entire surface of said coating.

The anti-fouling top coat is defined as a hydrophobic and/or oleophobic surface coating. The ones preferably used in this invention are those which reduce surface energy of the article to less than 20 mJ/m². The invention has a particular interest when using anti-fouling top coats having a surface energy of less than 14 mJ/m² and even better less than 12 mJ/m².

The surface energy values referred above are calculated according to Owens Wendt method, described in the following document: Owens, D. K.; Wendt, R. G. "Estimation of the surface force energy of polymers", *J. Appl. Polym. Sci.* 1969, 51, 1741-1747.

The anti-fouling top coat according to the invention is preferably of organic nature. By organic nature, it is meant a layer which is comprised of at least 40% by weight, preferably at least 50% by weight of organic materials, relative to the total weight of the coating layer. A preferred anti-fouling top coat is made from a liquid coating material comprising at least one fluorinated compound.

Hydrophobic and/or oleophobic surface coatings most often comprise silane-based compounds bearing fluorinated groups, in particular perfluorocarbon or perfluoropolyether group(s). By way of example, silazane, polysilazane or silicone compounds are to be mentioned, comprising one or more fluorine-containing groups such as those mentioned here above. Such compounds have been widely disclosed in the previous art, for example in Patents U.S. Pat. No. 4,410, 563, EP 0203730, EP 749021, EP 844265 and EP 933377.

A classical method to form an anti-fouling top coat consists in depositing compounds bearing fluorinated groups and Si—R groups, R representing an —OH group or a precursor thereof, such as —Cl, —NH$_2$, —NH— or —O-alkyl, preferably an alkoxy group. Such compounds may perform, at the surface onto which they are deposited, directly or after hydrolysis, polymerization and/or cross-linking reactions with pendent reactive groups.

Preferred fluorinated compounds are silanes and silazanes bearing at least one group selected from fluorinated hydrocarbons, perfluorocarbons, fluorinated polyethers such as F$_3$C—(OC$_3$F$_6$)$_{24}$—O—(CF$_2$)$_2$—(CH$_2$)$_2$—O—CH$_2$—Si(OCH$_3$)$_3$ and perfluoropolyethers, in particular perfluoropolyethers.

Among fluorosilanes there may be cited the compounds of formulae:

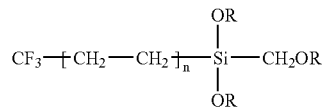

wherein n=5, 7, 9 or 11 and R is an alkyl group, typically a C$_1$-C$_{10}$ alkyl group such as methyl, ethyl and propyl;

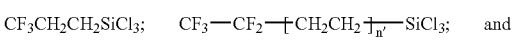

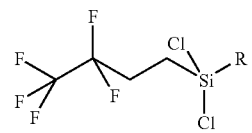

wherein n'=7 or 9 and R is as defined above.

Compositions containing fluorosilanes compounds also useful for making hydrophobic and/or oleophobic top coats are disclosed in U.S. Pat. No. 6,183,872. Such compositions comprise silicon-containing organic fluoropolymers represented by the below general formula and having a number average molecular weight of from 5×10² to 1×10⁵.

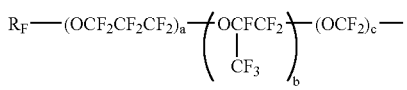

-continued

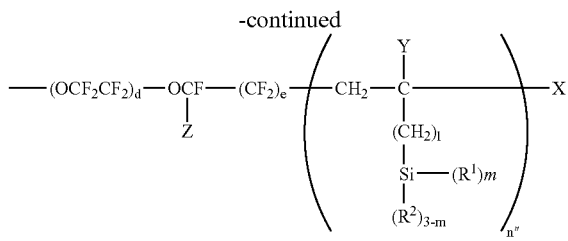

wherein $R_F$ represents a perfluoroalkyl group, Z represents a fluorine atom or a trifluoromethyl group, a, b, c, d and e each independently represent 0 or an integer equal to or higher than 1, provided that a+b+c+d+e is not less than 1 and the order of the repeating units parenthesized by subscripts a, b, c, d and e occurring in the above formula is not limited to that shown; Y represents a hydrogen atom or an alkyl group containing 1 to 4 carbon atoms; X represents a hydrogen, bromine or iodine atom; $R^1$ represents a hydroxyl group or a hydrolyzable substituent group; $R^2$ represents a hydrogen atom or a monovalent hydrocarbon group; l represents 0, 1 or 2; m represents 1, 2 or 3; and n" represents an integer equal to or higher than 1, preferably equal to or higher than 2.

Other preferred compositions for forming the hydrophobic and/or oleophobic surface coating are those containing compounds comprising fluorinated polyether groups, in particular perfluoropolyether groups. A particular preferred class of compositions containing fluorinated polyether groups is disclosed in U.S. Pat. No. 6,277,485. The anti-fouling top coats of U.S. Pat. No. 6,277,485 are at least partially cured coatings comprising a fluorinated siloxane prepared by applying a coating composition (typically in the form of a solution) comprising at least one fluorinated silane of the following formula:

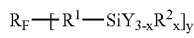

wherein $R_F$ is a monovalent or divalent polyfluoro polyether group; $R^1$ is a divalent alkylene group, arylene group, or combinations thereof, optionally containing one or more heteroatoms or functional groups and optionally substituted with halide atoms, and preferably containing 2 to 16 carbon atoms; $R^2$ is a lower alkyl group (i.e., a $C_1$-$C_4$ alkyl group); Y is a halide atom, a lower alkoxy group (i.e., a $C_1$-$C_4$ alkoxy group, preferably, a methoxy or ethoxy group), or a lower acyloxy group (i.e., —OC(O)$R^3$ wherein $R^3$ is a $C_1$-$C_4$ alkyl group); x is 0 or 1; and y is 1 ($R_F$ is monovalent) or 2 ($R_F$ is divalent). Suitable compounds typically have a molecular weight (number average) of at least about 1000. Preferably, Y is a lower alkoxy group and $R_F$ is a perfluoro polyether group.

Commercial compositions for making anti-fouling top coats are the compositions KY130® and KP 801M® commercialized by Shin-Etsu Chemical and the composition OPTOOL DSX® (a fluorine-based resin comprising perfluoropropylene moieties) commercialized by Daikin Industries. OPTOOL DSX® is the most preferred coating material for anti-fouling top coats.

The liquid coating material for forming the anti-fouling top coat of the invention may comprise one or more of the above cited compounds. Preferably, such compounds or mixtures of compounds are liquid or can be rendered liquid by heating, thus being in a suitable state for deposition.

The deposition techniques for such anti-fouling top coats are very diverse, including liquid phase deposition such as dip coating, spin coating (centrifugation), spray coating, or vapor phase deposition (vacuum evaporation). Of which, deposition by spin or dip coating is preferred.

If the anti-fouling top coat is applied under a liquid form, at least one solvent is added to the coating material so as to prepare a liquid coating solution with a concentration and viscosity suitable for coating. Deposition is followed by curing.

In this connection, preferred solvents are fluorinated solvents and alcanols such as methanol, preferably fluorinated solvents. Examples of fluorinated solvents include any partially or totally fluorinated organic molecule having a carbon chain with from about 1 to about 25 carbon atoms, such as fluorinated alkanes, preferably perfluoro derivatives and fluorinated ether oxides, preferably perfluoroalkyl alkyl ether oxides, and mixtures thereof. As fluorinated alkanes, perfluorohexane ("Demnum" from DAIKIN Industries) may be used. As fluorinated ether oxides, methyl perfluoroalkyl ethers may be used, for instance methyl nonafluoro-isobutyl ether, methyl nonafluorobutyl ether or mixtures thereof, such as the commercial mixture sold by 3M under the trade name HFE-7100. The amount of solvent in the coating solution preferably ranges from 80 to 99.99% in weight.

Optical articles according to the invention have low $R_m$ and $R_v$ values, high Tv and a very good abrasion resistance, which can be measured according to the Bayer test performed in accordance with the standard ASTM F735-94. They are free of optical defects such as cracks; withstand temperature variations, which is especially useful when expansion capabilities of the substrate and the AR film are very different. In addition, optical articles according to the invention have excellent properties of adhesion of the layers of the AR stack to the substrate. Adhesion can be evaluated using the n×10 blow test, defined in WO 99/49097.

Preferably, the mean reflection factor $R_m$ in the visible range (400-700 nm) of an optical article coated on both sides with the inventive AR coating is $\leq 2\%$, more preferably $\leq 1.5\%$, even better $\leq 1\%$ and still better $\leq 0.8\%$. According to the most preferred embodiment of the invention, the optical article has a $R_m$ value ranging from 0.7 to 0.8.

Preferably, the mean reflection factor $R_m$ in the visible range (400-700 nm) on the main face of an optical article which is coated with the inventive AR coating is $\leq 1\%$, more preferably $\leq 0.75\%$, even better $\leq 0.5\%$ and still better $\leq 0.4\%$. According to the most preferred embodiment of the invention, said main face of the optical article has a $R_m$ value ranging from 0.35 to 0.4.

Preferably, the mean luminous reflection factor $R_v$ in the visible range (380-780 nm) of an optical article coated on both sides with the inventive AR coating is $\leq 2\%$, more preferably $\leq 1.5\%$, even better $\leq 1\%$ and still better $\leq 0.8\%$. According to the most preferred embodiment of the invention, the optical article has a $R_m$ value ranging from 0.7 to 0.8.

Preferably, the mean luminous reflection factor $R_v$ in the visible range (380-780 nm) on the main face of an optical article which is coated with the inventive AR coating is $\leq 1\%$, more preferably $\leq 0.75\%$, even better $\leq 0.5\%$ and still better $\leq 0.4\%$. According to the most preferred embodiment of the invention, said main face of the optical article has a $R_m$ value ranging from 0.35 to 0.4.

Means for achieving low $R_v$ and $R_m$ values are well known by the person skilled in the art of anti-reflection coating.

Preferably, the inventive anti-reflection coating is such that the optical article, when coated on both sides with said coating, has a luminous absorption due to the AR coating in the visible range of preferably 1% or less, more preferably less than 1%, and/or a relative light transmission factor in the visible spectrum, Tv, preferably higher than 90%, more preferably higher than 95%, even more preferably higher than 96%, and even better higher than 98%. Preferably, both features are simultaneously satisfied.

As used herein, the "mean reflection factor" $R_m$ (corresponding to the average spectral reflection from 400 to 700 nm) and the "mean luminous reflection factor" $R_v$ (corresponding to the average spectral reflection from 380 to 780 nm (ponderated value)) are defined in the standard ISO 13666:1998 and are measured according to the standard ISO 8980-4 published by the International Organization for Standardization (ISO) in 2000.

"Luminous transmittance" or "relative light transmission factor in the visible spectrum" Tv (or τv) is also defined in the standard ISO 13666:1998 and is measured according to the standard ISO 8980-3 (from 380 to 780 nm).

The present invention also relates to a method of manufacturing the above described optical articles, comprising the steps of:
providing an optical article having two main faces,
forming on at least one main face of said optical article an anti-reflection coating such as described above, optionally comprising a sub-layer,
wherein the layers of the anti-reflection coating are deposited by vacuum deposition.

When present, the sub-layer is the first layer of the AR coating to be deposited.

Such a process avoids heating the substrate, which is particularly interesting in the case of organic glasses. Vacuum methods for the deposition of the different layers of the AR stack (the AR layers or the optional sub-layer) include: i) evaporation; ii) spraying with an ion beam; iii) cathode sputtering; iv) plasma assisted chemical vapor deposition. These techniques are described in detail in "Thin Film Processes" and "Thin Film Processes II," Vossen & Kern, Ed., Academic Press, 1978 and 1991 respectively. The particularly recommended technique is vacuum evaporation.

The optional electrically conductive layer, which generally is a HI layer of the anti-reflection stack, may be deposited according to any appropriate method, for example by vacuum evaporation, optionally under ion assistance (IAD: Ion Assisted Deposition), or by a sputtering technique. The IAD method comprises packing said layer with heavy ions while it is being formed, so as to increase its density, adhesion and refractive index. It requires an ion plasma in a gas atmosphere, such as argon and/or oxygen.

IAD treatment and IPC pre-treatment may be performed with an ion gun, the ions being particles made from gas atoms from which an electron has been extracted. Preferably, such treatments comprise bombardment of the surface to be treated with argon ions ($Ar^+$), with a current density ranging from 10 to 100 $\mu A/cm^2$ on the activated surface and under a pressure which may range from $8.10^{-5}$ mBar to $2.10^{-4}$ mBar in the vacuum chamber.

Surface pre-treatments such as IPC (Ion pre-cleaning) are performed at a stage in which the outermost coating layer of the substrate is the hard coat.

The optical article to be coated with the AR coating of the present invention may be a finished lens or a semi-finished lens. One of its main faces may have previously been coated with an appropriate coating stack (anti-reflection, hard coat, primer coating, impact resistant coating, etc.).

The process of the invention presents many advantages. For example, its implementation requires no modification of the original tweaking of the traditional process for depositing an AR coating, no modification of the deposition apparatus, no various additional equipments.

The invention is further illustrated by the examples described below. These examples are meant to illustrate the invention and are not to be interpreted as limiting the scope of the invention.

EXAMPLES

1. Preparation of the Lenses: General Procedure

The optical articles used in the examples were semi-finished ORMA® 4.50 base round lenses surfaced to a power of −2.00 diopters and a diameter of 70 mm. ORMA® is a registered trade mark of Essilor. This substrate is obtained by polymerizing a diethylene glycol bis(allyl carbonate)monomer, typically CR-39®.

The lenses were spin-coated on concave side with a polysiloxane-type abrasion- and/or scratch resistant coating (hard coat; thickness: 1.8 µm) based on a hydrolyzate of GLYMO, washed in a cleaning line including washing in acetic acid, rinsing with water and deionized water followed by hot air drying) and steamed for 4 hours at 80° C. before AR-coating or 3 hours at 120° C.

The lenses were then placed on a carrousel provided with circular openings intended to accommodate the lenses to be treated, the concave side facing the evaporation sources and the ion gun.

A pumping operation was performed until a secondary vacuum was reached. The substrate surface was activated by irradiating it with an argon ion beam, using an ion gun (Ion pre-cleaning step). Then, after the ion irradiation has been interrupted, a successive evaporation of the required number of anti-reflection optical layers was performed, with the electron gun as an evaporation source, as described below.

Finally, a hydrophobic and oleophobic coating layer of OF110 material sold by Optron Inc. was deposited by vacuum evaporation. The thickness of the resulting hydrophobic and oleophobic coating ranged from 2 to 5 nm.

Thus, organic glasses were prepared, bearing, starting from the substrate, an anti-abrasion coating, an anti-reflection coating and a hydrophobic and oil-repellent coating.

2. Deposition of the Anti-reflection Coating: Experimental Details

For Examples 1 to 5

The dielectric materials for deposition were used under the form of granulates. $SiO_2$ was supplied by Canon Optron Inc., $ZrO_2$ and $SiO_2/Al_2O_3$ (LIMA®) were supplied by Umicore Materials AG, $TiO_2$, $LaTiO_3$, $SiO_2/Al_2O_3$ (L5®) and $PrTiO_3$ were supplied by Merck.

The vacuum treating machine used for deposition of the anti-reflection stack was a BAK 760 vacuum chamber with Physimeca software retrofit, provided with an electron gun 8 kV for evaporation of the oxides, an ion gun of the "end-Hall" Mark II Commonwealth type for the preliminary surface preparation with argon ions, a Joule effect crucible, a quartz scale and a Meissner trap and baffle coil connected LN2 line. Thickness of the deposited layers was followed using the quartz scale, allowing stopping the evaporation once the required thickness was reached. Pressure into the chamber was measured with a Granville-Phillips Micro Ion gauge.

The layers of the AR stack were deposited without heating of the substrate by vacuum evaporation (reactive for HI materials).

For Examples 6, 7 and 8

The dielectric materials for deposition were used under the form of granulates. $SiO_2$ was supplied by Canon Optron Inc., $ZrO_2$, $TiO_2$ and $SiO_2/Al_2O_3$ (LIMA®) were supplied by Umicore Materials AG.

The vacuum treating machine used for deposition of the anti-reflection stack was a Satis 900 vacuum chamber with Physimeca software retrofit, provided with an electron gun 8 kV for evaporation of the oxides, an ion gun of the "end-Hall" Mark II Commonwealth type for the preliminary surface preparation with argon ions, a Joule effect crucible, a quartz scale and a Meissner trap and baffle coil connected to a Polycold PFC 660 HC unit. Thickness of the deposited layers was followed using the quartz scale, allowing stopping the evaporation once the required thickness was reached. Pressure into the chamber was measured with a Granville-Phillips Micro Ion gauge.

The layers of the AR stack were deposited without heating of the substrate by vacuum evaporation (reactive for HI materials).

Deposition Process:

Examples 1 to 8

A pumping operation was performed until a secondary vacuum was reached ($2.10^{-5}$ to $3.10^{-5}$ mBar). Then, the substrate surface was activated by IPC (Ion pre-cleaning) for 2 minutes (1 A, 100V). The first HI layer ($TiO_2$, $ZrO_2$, $LaTiO_3$ or $PrTiO_3$) was deposited without IAD (reactive deposition with $O_2$; Partial $O_2$ pressure: $8.10^{-5}$ mBar for $ZrO_2$, $10^{-4}$ mBar for $TiO_2$), the first LI layer ($SiO_2$ or $SiO_2/Al_2O_3$) was deposited, the second HI layer ($TiO_2$, $ZrO_2$, $LaTiO_3$ or $PrTiO_3$) was deposited without IAD (reactive deposition with $O_2$; Partial $O_2$ pressure: $7.10^{-5}$ to $8.10^{-5}$ mBar for $ZrO_2$, $10^{-4}$ mBar for $TiO_2$. Finally, the second LI layer ($SiO_2$ or $SiO_2/Al_2O_3$) was deposited.

Deposition rates were 0.26-0.34 nm/s for the first LI layer, 0.77-0.89 nm/s for the first HI layer, 0.27-0.35 nm/s for the second LI layer and 1-1.3 nm/s for the second HI layer.

Comparative examples CE1 to CE6, the stacks of which are described in table 1, have been prepared according to the same deposition process as described above. Only the first HI layer was deposited at reduced rate, the other ones were deposited at a higher rate of 1-1.3 nm.

3. Heat-resistance Test: Determination of the Critical Temperature ($T_C$)

The heat resistance test is performed less than 48 hours after preparation of the lenses. The prepared lenses were put into an oven preheated to a selected temperature, and were left there for 1 hour. They were removed from the oven and visually evaluated by reflection in terms of the presence of cracks under a desk lamp. This experiment was performed at different temperatures, starting from 50° C. and raising the heating temperature in 5° C. increments. The temperature was measured, at which the lenses could not withstand the heat treatment and were cracked after 1 hour. This temperature is given as the critical temperature in the tables below. When several lenses have been tested, the critical temperature mentioned is the average value.

4. Determination of the Optical Characteristics

Mean reflection factors $R_m$ and $R_v$ throughout the visible range were recorded and allow to quantify performance of the AR coating and color of the residual reflection in the color space CIE L*a*b* (1976). Colorimetric coefficients were generated from these factors, taking into account standard illuminant $D_{65}$ (daylight) and standard colorimetric observer based on visual stimuli extending 10°. C* defines chroma, L* defines lightness and h represents hue angle. Optical characteristics of some prepared lenses are given in table 2.

5. Determination of the Abrasion Resistance (Bayer Test)

The Bayer abrasion test is a standard test used to determine the abrasion resistance of curved/lens surfaces. Determination of the Bayer value was performed in accordance with the standards ASTM F 735-94 (Standard Test Method for Abrasion Resistance of Transparent Plastics and Coatings Using Oscillating Sand Method) and ISO CD 15258 (Bayer Abrasion test for ophthalmic lenses), with a higher Bayer value meaning a higher abrasion resistance.

Per this test, a coated lens is mounted and held tightly using clamps on the bottom of a tray next to an uncoated CR-39® reference lens of similar curvature, diameter, thickness and diopter. An abrasive powder (sand) of specified grain size is poured evenly over the lenses and the tray, and the tray is oscillated at a period of 100 cycles/minutes for two minutes. Oscillation is achieved using a motor that is connected to an oscillating plate through a revolving wheel. The coated lens and the reference are then removed and the haze and transmittance of both the reference and coated sample are measured with a Haze Guard Plus meter, in accordance with ASTM D1003-00, before and after the test has been performed. The results are expressed as a calculated ratio of the standard CR-39® test lens to the coated lens (haze gain caused by the abrading sand). The Bayer value is set to 1 for the reference CR-39® lens. Only fresh sand is used for each measurement.

Abrasion resistance results of some prepared lenses are reported in table 3 (the test was carried out with 12×3 lenses).

6. Evaluation of the Adhesion Properties of the Coatings (n×10 Blow Test)

A qualitative test was carried out using the procedure known as the "n×10 blow test." This procedure makes it possible to evaluate adhesion of a film deposited on a substrate, such as an ophthalmic lens. The test was performed such as described in international patent application WO 99/49097.

The operator checked the state of the tested lens every 3 cycles, by visually inspecting the lens. He noted the cycle number through which a defect appeared for the first time. Consequently, the higher the test value, the better the adhesion of the layers of the AR stack to the substrate. For comparison purposes, a standard anti-reflection glass has n×10 blow values in the order of 3.

n×10 blow test results of some prepared lenses are reported in table 2 (the test was carried out with 30 identical lenses).

7. Results

The stacks obtained according to examples 1 to 8 and comparative examples 1 to 6 are detailed on table 1 below. The $T_C$ measurements and $R_T$ ratios for the anti-reflection coatings prepared are presented in the same table. The layers which are not taken into consideration for $R_T$ calculation appear in grey.

As can be seen, using a high $R_T$ ratio allows obtaining a high critical temperature. This is true whatever the number of layers.

The significance of calculating $R_T$ on the whole stack (if the stack does not comprise a thick inner LI layer of $\geq 100$ nm thickness) is revealed by comparison of stacks of examples 1 and CE1. If said ratio was calculated taking into account the two last deposited layers, high values would be obtained for stacks 1 (2.51) and CE1 (2.41). However, stack CE1 exhibits a low $T_C$, while stack 1 exhibits a high $T_C$.

It is clear from the stack of comparative example 2 that $R_T$ ratio must not be calculated on the whole stack if said stack comprises a thick inner LI layer ($\geq$100 nm thickness). If said ratio was calculated taking into account the four last deposited layers, or all the anti-reflection layers, high values would be obtained, 3.18 and 4.68 respectively, which cannot be correlated with the low $T_C$ value. If the only layers to be taken into consideration are those lying above the thick LI layer which is the furthest from the substrate, a low $R_T$ value is obtained (0.76), which can be correlated with the low $T_C$ value.

It is also clear from stack of comparative example 4 that the thick sub-layer ($\geq$100 nm) must not be taken into account for $R_T$ calculations (otherwise, a value of 2.22 would be obtained, which is comparable to that of stacks 1 and 5).

Comparative example 5, when compared to comparative example 4, shows that the suppression of the sub-layer does not modify Tc.

Shifting from an AR stack having a $R_T$ ratio of 0.95 to an AR stack having a $R_T$ ratio of 2.27 (with the same materials) generally leads to an appreciable increase in the critical temperature. Generally, substitution of $SiO_2/Al_2O_3$ for $SiO_2$ in the low refractive index anti-reflection layers also leads to an appreciable increase in the critical temperature. Generally, substitution of $SiO_2/Al_2O_3$ with 8% $Al_2O_3$ for $SiO_2/Al_2O_3$ with 4% $Al_2O_3$ in the low refractive index anti-reflection layers also leads to an appreciable increase in the critical temperature, but also to a slight decrease in the abrasion resistance.

The lens of example 8 (HI: $TiO_2$, BI: $SiO_2/Al_2O_3$ with 8% $Al_2O_3$ into $SiO_2$) exhibits the best temperature performances. No decrease of the critical temperature was noted after one week. After one month, the critical temperature of the lenses of examples 7 and 8 were still very high (90° C. and 91° C. respectively).

TABLE 1

| Comparative example 1 | |
|---|---|
| Substrate + hard coat | |
| $SiO_2$ | 15 nm |
| $TiO_2$ | 12 nm |
| $SiO_2$ | 33 nm |
| $TiO_2$ | 42 nm |
| $SiO_2$ | 16 nm |
| $TiO_2$ | 37 nm |
| $SiO_2$ | 89 nm |
| Top coat | |
| Air | |
| $T_C$ | 70° C. |
| $R_T$ | 1.68 |

| Comparative example 2 | |
|---|---|
| Substrate + hard coat | |
| $SiO_2$ | 22 nm |
| $TiO_2$ | 2 nm |
| $SiO_2$ | 163 nm |
| $TiO_2$ | 10 nm |
| $SiO_2$ | 291 nm |
| $TiO_2$ | 107 nm |
| $SiO_2$ | 81 nm |
| Top coat | |
| Air | |
| $T_C$ | 70° C. |
| $R_T$ | 0.76 |

TABLE 1-continued

| Comparative example 3 | |
|---|---|
| Substrate + hard coat | |
| $ZrO_2$ | 27 nm |
| $SiO_2$ | 21 nm |
| $ZrO_2$ | 80 nm |
| $SiO_2$ | 81 nm |
| Top coat | |
| Air | |
| $T_C$ | 70° C. |
| $R_T$ | 0.95 |

| Comparative example 4 | |
|---|---|
| Substrate + hard coat | |
| $SiO_2$ | 184 nm |
| $TiO_2$ | 18 nm |
| $SiO_2$ | 26 nm |
| $TiO_2$ | 113 nm |
| $SiO_2$ | 81 nm |
| Top coat | |
| Air | |
| $T_C$ | 75° C. |
| $R_T$ | 0.82 |

| Comparative example 5 | |
|---|---|
| Substrate + hard coat | |
| $TiO_2$ | 18 nm |
| $SiO_2$ | 26 nm |
| $TiO_2$ | 113 nm |
| $SiO_2$ | 81 nm |
| Top coat | |
| Air | |
| $T_C$ | 78° C. |
| $R_T$ | 0.82 |

| Example 1 (invention) | |
|---|---|
| Substrate + hard coat | |
| $ZrO_2$ | 23 nm |
| $SiO_2$ | 42 nm |
| $ZrO_2$ | 41 nm |
| $SiO_2$ | 103 nm |
| Top coat | |
| Air | |
| $T_C$ | 94° C. |
| $R_T$ | 2.27 |

| Example 2 (invention) | |
|---|---|
| Substrate + hard coat | |
| $ZrO_2$ | 23 nm |
| $SiO_2/Al_2O_3$ | 42 nm |
| $ZrO_2$ | 41 nm |
| $SiO_2/Al_2O_3$ | 103 nm |
| Top coat | |
| Air | |
| $T_C$ (**) | 108° C. |
| $T_C$ (***) | 110° C. |
| $R_T$ | 2.27 |

| Example 3 (invention) | |
|---|---|
| Substrate + hard coat | |
| $PrTiO_3$ | 23 nm |
| $SiO_2$ | 42 nm |
| $PrTiO_3$ | 41 nm |
| $SiO_2$ | 103 nm |
| Top coat | |
| Air | |
| $T_C$ | 98° C. |
| $R_T$ | 2.27 |

| Example 4 (invention) | |
|---|---|
| Substrate + hard coat | |
| $PrTiO_3$ | 23 nm |
| $SiO_2/Al_2O_3$ | 42 nm |
| $PrTiO_3$ | 41 nm |
| $SiO_2/Al_2O_3$ | 103 nm |
| Top coat | |
| Air | |
| $T_C$ (**) | 107° C. |
| $T_C$ (***) | 114° C. |
| $R_T$ | 2.27 |

TABLE 1-continued

| Comparative example 6 | |
|---|---|
| Substrate + hard coat | |
| LaTiO$_3$ | 27 nm |
| SiO$_2$ | 21 nm |
| LaTiO$_3$ | 80 nm |
| SiO$_2$ | 81 nm |
| Top coat | |
| Air | |
| T$_C$ | 84° C. |
| R$_T$ | 0.95 |

| Example 5 (invention) | |
|---|---|
| Substrate + hard coat | |
| LaTiO$_3$ | 23 nm |
| SiO$_2$ | 42 nm |
| LaTiO$_3$ | 41 nm |
| SiO$_2$ | 103 nm |
| Top coat | |
| Air | |
| T$_C$ | 97° C. |
| R$_T$ | 2.27 |

TABLE 2

Optical characteristics of some prepared lenses.

| | Example | | | | | |
|---|---|---|---|---|---|---|
| | 1 | 2 | 3 | 6 | 7 | 8 |
| h (°) | 130 | 150 | 140 | 159 | 159 | 159 |
| C* | 7.2 | 8.5 | 8.5 | 7.1 | 9.3 | 9.5 |
| R$_m$ | 0.90 | 0.90 | 0.85 | 0.76 | 0.79 | 0.80 |
| R$_v$ | 0.90 | 0.90 | 0.85 | 0.68 | 0.74 | 0.75 |
| Tv (%) | 97.5 | 97.5 | 97.8 | 97.7 | 96.6 | 96.7 |
| n × 10 blow | | | | >50 | >50 | >50 |

R$_v$ and R$_m$ which appear in table 2 are reflection factors per each face of the lens. Total reflection factors for the whole lens (due to both faces of the AR coated lens) are twice those values.

TABLE 3

Abrasion resistance of some prepared lenses.

| Example | CE3 | 1 | 2 | 3 | 4 | 6 | 7 | 8 |
|---|---|---|---|---|---|---|---|---|
| Bayer test | 5.0 | 5.7 | 6.2 () <br> 5.7 (*) | 4.6 | 6.4 () <br> 6.0 (*) | 8.0 | 6.5 () | 5.9 (**) |

Data of comparative examples appear in grey.

TABLE 1-continued

| Example 6 (invention) | |
|---|---|
| Substrate + hard coat | |
| TiO$_2$ | 19 nm |
| SiO$_2$ | 46 nm |
| TiO$_2$ | 28 nm |
| SiO$_2$ | 104 nm |
| Top coat | |
| Air | |
| T$_C$ | 85° C. |
| R$_T$ | 3.19 |

| Example 7 (invention) | |
|---|---|
| Substrate + hard coat | |
| TiO$_2$ | 19 nm |
| SiO$_2$/Al$_2$O$_3$ | 46 nm |
| TiO$_2$ | 28 nm |
| SiO$_2$/Al$_2$O$_3$ | 104 nm |
| Top coat | |
| Air | |
| T$_C$ (**) | 90° C. |
| R$_T$ | 3.19 |

| Example 8 (invention) | |
|---|---|
| Substrate + hard coat | |
| TiO$_2$ | 19 nm |
| SiO$_2$/Al$_2$O$_3$ | 46 nm |
| TiO$_2$ | 28 nm |
| SiO$_2$/Al$_2$O$_3$ | 104 nm |
| Top coat | |
| Air | |
| T$_C$ (****) | 110° C. |
| R$_T$ | 3.19 |

(*) Sub-layer
SiO$_2$/Al$_2$O$_3$ was:
(**) LIMA ® 4 from Umicore, having 4% by weight of Al$_2$O$_3$.
(***) L5 ® from Merck.
(****) SiO$_2$ with 8% by weight of Al$_2$O$_3$.

It is to be understood that the present description and examples illustrate aspects of the invention relevant to a clear understanding of the invention. Certain aspects of the invention that would be apparent to those of ordinary skill in the art and that, therefore, would not facilitate a better understanding of the invention have not been presented in order to simplify the present description. Although the present invention has been described in connection with certain embodiments, the present invention is not limited to the particular embodiments or examples disclosed, but is intended to cover modifications that are within the spirit and scope of the invention, as defined by the appended claims.

The invention claimed is:

1. An optical article having anti-reflection properties comprising a substrate having at least one main face coated with a multi-layer anti-reflection coating comprising a stack of at least one high refractive index layer and at least one low refractive index layer, wherein:

each low refractive index layer has a refractive index of 1.55 or less;

each high refractive index layer has a refractive index higher than 1.55 and does not comprise niobium pentoxide (Nb$_2$O$_5$);

said coated main face of the optical article has a mean luminous reflection factor Rv ≦1%; and:

(a) the low refractive index layers of the anti-reflection coating below the outermost layer of said coating each have a physical thickness <100 nm, the ratio $$R_T = \frac{\text{sum of the physical thicknesses of the low refractive index layers of the anti-reflection coating}}{\text{sum of the physical thicknesses of the high refractive index layers of the anti-reflection coating}}$$

is higher than 2.1, and the anti-reflection coating does not comprise a sub-layer comprising niobium (Nb); or
(b) the anti-reflection coating comprises:
at least one low refractive index layer having a physical thickness ≧100 nm which is not the outermost layer of the anti-reflection coating; and
at least one high refractive index layer and at least one low refractive index layer, which are located above the low refractive index layer having a physical thickness ≧100 nm and not being the outermost layer of the anti-reflection coating which is the furthest from the substrate, and the ratio $$R_T = \frac{\text{sum of the physical thicknesses of the low refractive index layers of the anti-reflection coating}}{\text{sum of the physical thicknesses of the high refractive index layers of the anti-reflection coating}}$$

is higher than 2.1, with the proviso that the layers of the anti-reflection coating taken into account for the calculation of said ratio RT are only the layers located above the low refractive index layer having a physical thickness ≧100 nm and not being the outermost layer of the anti-reflection coating which is the furthest from the substrate.

2. The optical article of claim 1, wherein the anti-reflection coating (b) does not comprise a sub-layer comprising niobium (Nb).

3. The optical article of claim 1, wherein RT is higher than or equal to 2.15.

4. The optical article of claim 3, wherein RT is higher than or equal to 2.2.

5. The optical article of claim 4, wherein RT is higher than or equal to 2.25.

6. The optical article of claim 5, wherein RT is higher than or equal to 2.3.

7. The optical article of claim 1, further defined as having a critical temperature ≧75° C.

8. The optical article of claim 1, wherein the high refractive index layers of the anti-reflection coating comprise at least one of $TiO_2$, $PrTiO_3$, or $ZrO_2$.

9. The optical article of claim 1, wherein at least one high refractive index layer of the anti-reflection stack comprises $TiO_2$.

10. The optical article of claim 1, wherein at least one low refractive index layer of the anti-reflection stack comprises a mixture of $SiO_2$, and $Al_2O_3$.

11. The optical article of claim 1, wherein all the low refractive index layers of the anti-reflection coating comprise a mixture of $SiO_2$, and $Al_2O_3$, except the low refractive index layers of the sub-layer, if said anti-reflection coating comprises a sub-layer having at least one low refractive index layer.

12. The optical article of claim 1, wherein the anti-reflection coating comprises a sub-layer.

13. The optical article of claim 12, wherein the sub-layer is a $SiO_2$ based mono-layer sub-layer further defined as free of $Al_2O_3$.

14. The optical article of claim 12, wherein the sub-layer is a multi-layer sub-layer consisting of:
one layer consisting of $SiO_2$; and
at most three layers interleaved between said layer consisting of $SiO_2$ and the substrate of the optical article.

15. The optical article of claim 12, wherein the sub-layer consists of a thin layer of at least one metal or metal oxide having 10 nm thickness or less.

16. The optical article of claim 1, wherein the anti-reflection coating comprises at least one electrically conductive layer.

17. The optical article of claim 16, wherein the electrically conductive layer comprises at least one indium oxide, tin oxide, or zinc oxide.

18. The optical article of claim 16, wherein the electrically conductive layer comprises indium-tin oxide.

19. The optical article of claim 1, wherein the substrate is an organic or mineral glass substrate.

20. The optical article of claim 19, wherein the substrate is an organic glass substrate having a thermal expansion coefficient of $50.10^{-6}$ $C.^{-1}$ to $180.10^{-6}$ $C.^{-1}$.

21. The optical article of claim 1, further defined as a finished or semi-finished lens.

22. The optical article of claim 1, wherein the substrate comprises an abrasion- and/or scratch-resistant coating, an impact-resistant coating, or an impact-resistant coating coated with an abrasion- and/or scratch-resistant coating.

23. A method of manufacturing an optical article having anti-reflection properties, comprising:
providing an optical article having two main faces; and
forming on at least one main face of said optical article an anti-reflection coating of claim 1 by forming layers of the anti-reflection coating via vacuum deposition.

24. A method according to claim 23, wherein the layers of the anti-reflection coating are deposited by vacuum evaporation.

25. A process for obtaining an optical article comprising a substrate having at least one main face coated with a multi-layer anti-reflection coating and having a critical temperature ≧75° C., wherein said anti-reflection coating exhibits a $R_T$ ratio higher than 2.1, $R_T$ being defined as:

$$R_T = \frac{\text{sum of the physical thicknesses of the low refractive index layers of the anti-reflection coating}}{\text{sum of the physical thicknesses of the high refractive index layers of the anti-reflection coating}}$$

and wherein:
the multi-layer anti-reflection coating comprises a stack of at least one high refractive index layer and at least one low refractive index layer;
each low refractive index layer has a refractive index of 1.55 or less;

each high refractive index layer has a refractive index higher than 1.55 and does not comprise niobium pentoxide ($Nb_2O_5$);

said coated main face of the optical article has a mean luminous reflection factor Rv $\leq$1%, and:

(a) the low refractive index layers of the anti-reflection coating below the outermost layer of said coating each have a physical thickness <100 nm and the anti-reflection coating does not comprise a sub-layer comprising niobium (Nb); or:

(b) the anti-reflection coating comprises:

at least one low refractive index layer having a physical thickness $\geq$100 nm which is not the outermost layer of the anti-reflection coating; and at least one high refractive index layer and at least one low refractive index layer, which are located above the low refractive index layer having a physical thickness $\geq$100 nm and not being the outermost layer of the anti-reflection coating which is the furthest from the substrate; with the proviso that the layers of the anti-reflection coating taken into account for the calculation of said ratio RT are only the layers located above the low refractive index layer having a physical thickness $\geq$100 nm and not being the outermost layer of the anti-reflection coating which is the furthest from the substrate.

26. The process of claim 25, wherein the anti-reflection coating (b) does not comprise a sub-layer comprising niobium (Nb).

* * * * *